(12) United States Patent
Shiraga

(10) Patent No.: US 10,534,413 B2
(45) Date of Patent: Jan. 14, 2020

(54) ELECTRONIC DEVICE

(71) Applicant: Panasonic Intellectual Property Management Co., Ltd., Osaka (JP)

(72) Inventor: Kazuhiro Shiraga, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/022,539

(22) Filed: Jun. 28, 2018

(65) Prior Publication Data
US 2018/0307285 A1 Oct. 25, 2018

Related U.S. Application Data

(63) Continuation of application No. PCT/JP2016/005191, filed on Dec. 20, 2016.

(30) Foreign Application Priority Data

Jan. 15, 2016 (JP) .................. 2016-006266

(51) Int. Cl.
*G06F 1/20* (2006.01)
*H05K 7/20* (2006.01)

(52) U.S. Cl.
CPC ............... *G06F 1/203* (2013.01); *H05K 7/20* (2013.01); *H05K 7/2039* (2013.01);
(Continued)

(58) Field of Classification Search
CPC .. G06F 1/203; G06F 1/16; G06F 1/20; H05K 7/20; H05K 7/2039; H05K 7/20436; H05K 7/20454; H05K 7/20472; H05K 7/2049
(Continued)

(56) References Cited

U.S. PATENT DOCUMENTS

2004/0159935 A1* 8/2004 Ghosh ..................... H01L 23/34
257/712
2009/0139690 A1* 6/2009 Maerz ................... H01L 23/367
165/80.2
(Continued)

FOREIGN PATENT DOCUMENTS

JP 2000-078862 A 3/2000
JP 2012-227350 A 11/2012
(Continued)

OTHER PUBLICATIONS

International Search Report for corresponding International App. No. PCT/JP2016/005191, dated Feb. 7, 2017.

*Primary Examiner* — Anatoly Vortman
(74) *Attorney, Agent, or Firm* — Renner, Otto, Boisselle & Sklar, LLP

(57) ABSTRACT

A heat conductor of electronic device 1 includes a heat conductive rubber having elasticity, a heat conductive plate having elasticity so as to be bending deformable, and heat conductive support members, which are disposed between a bottom face of a housing and a CPU in order in a direction from the CPU to the bottom face so as to abut the bottom face and the CPU. The heat conductive support members are configured to abut the heat conductive plate at a plurality of positions separated away from the heat conductive rubber in a surface direction. The heat conductive plate bending-deformed toward the bottom face is supported by the heat conductive rubber and the heat conductive support members.

4 Claims, 4 Drawing Sheets

(52) U.S. Cl.
CPC ....... *H05K 7/2049* (2013.01); *H05K 7/20436* (2013.01); *H05K 7/20454* (2013.01); *H05K 7/20472* (2013.01)

(58) Field of Classification Search
USPC .................................................... 361/679.54
See application file for complete search history.

(56) References Cited

U.S. PATENT DOCUMENTS

| 2014/0022733 | A1* | 1/2014 | Lim ..................... H05K 7/2039 361/718 |
| 2017/0194548 | A1* | 7/2017 | Wakino ................... H01L 35/10 |
| 2018/0199472 | A1* | 7/2018 | Nakanishi ............... H01L 23/00 |

FOREIGN PATENT DOCUMENTS

| JP | 2014-116335 A | 6/2014 |
| WO | 2013/105138 A1 | 7/2013 |

* cited by examiner

ELECTRONIC DEVICE

BACKGROUND

1. Technical Field

The present disclosure relates to an electronic device including a heating element in a housing.

2. Description of Related Art

Unexamined Japanese Patent Publication No. 2014-116335 discloses an electronic device configured to transmit heat generated in a central processing unit (CPU) to a housing via a heat conductive sheet having higher thermal conductivity and elasticity.

SUMMARY

An electronic device according to the present disclosure includes a housing, a heating element mounted on a circuit board accommodated in and fixed to the housing, and a heat conductor for transmitting heat generated in the heating element to the housing.

The heat conductor includes a heat conductive rubber having elasticity, a heat conductive plate having bending elasticity, and heat conductive support members, which are disposed between a face of the housing and the heating element in order in a direction from the heating element to the face so as to abut the face and the heating element.

The heat conductive support members are configured to abut the heat conductive plate at a plurality of positions separated away from the heat conductive rubber in a surface direction.

The heat conductive plate bending-deformed toward the face is supported by the heat conductive rubber and the heat conductive support members.

According to the present disclosure, heat radiation performance and shock proof performance can be improved in an electronic device including a housing having a thinner thickness.

DETAILED DESCRIPTION

Hereinafter, exemplary embodiments will be described in detail with reference to the drawings as appropriate. Note, however, that unnecessarily detailed descriptions will sometimes be omitted. For example, in some cases, detailed description of already well-known items and repeated description with respect to substantially the same configuration will be omitted. These omissions are made to avoid unnecessary redundancy of the following description and to facilitate the understanding of those skilled in the art.

Note that the inventor of the present disclosure provides the accompanying drawings and the following description in order to allow those skilled in the art to fully understand the present disclosure, and do not intend to limit the subject matter as described in the appended claims.

First Exemplary Embodiment

Figure 1:
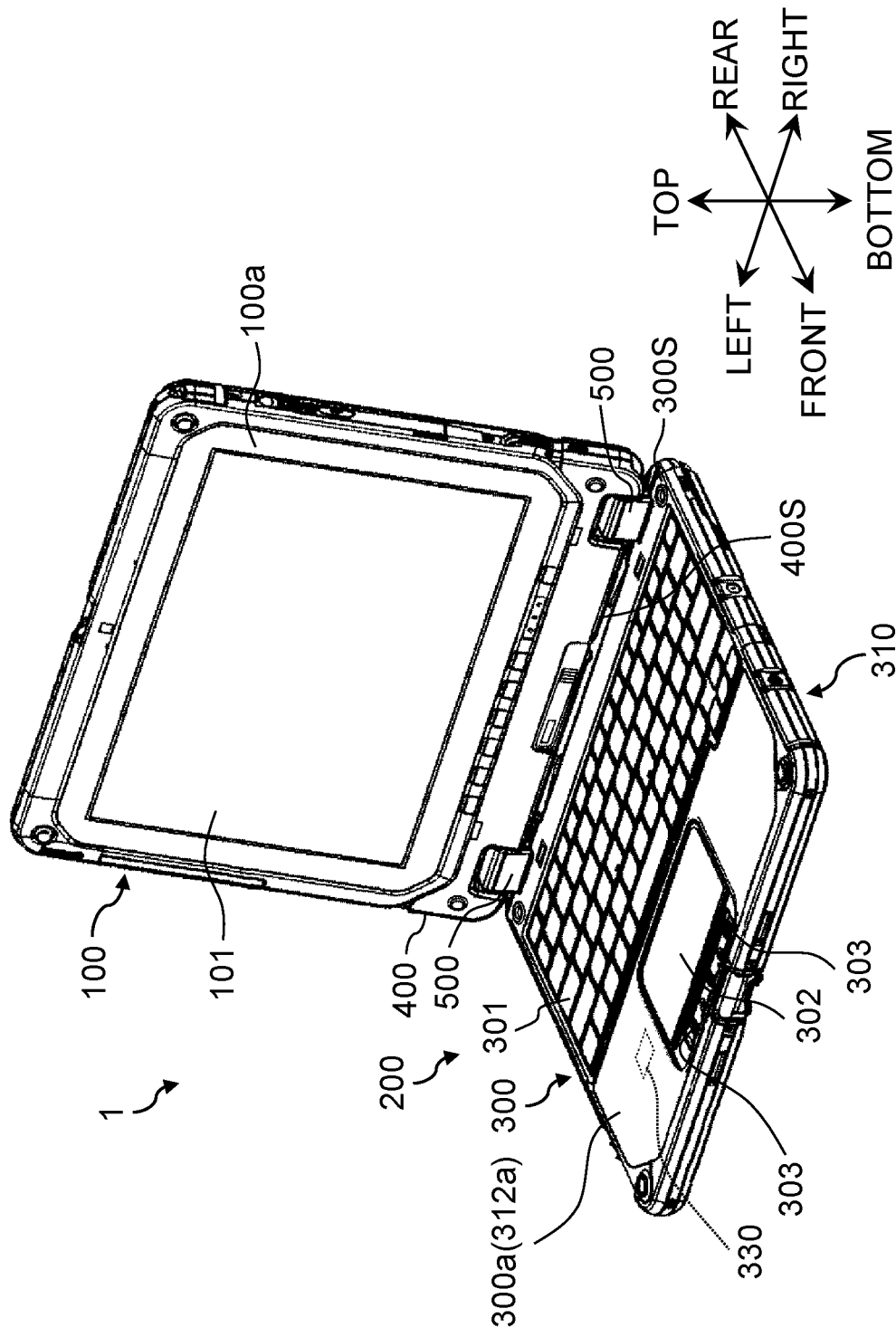
FIG. 1 is a front perspective view of an electronic device according to an exemplary embodiment.

A first exemplary embodiment will be described below with reference to the drawings.
1. Configuration
1-1. Outline of Electronic Device FIG. 1 is a front perspective view of electronic device 1 according to this exemplary embodiment. FIG. 1 illustrates an appearance of electronic device 1 being open.

As shown in FIG. 1, electronic device 1 includes first unit 100 (tablet computer), and second unit 200 (including keyboard 301 and others). First unit 100 and second unit 200 are detachable, so that electronic device 1 is configured as what is called a detachable computer. In FIG. 1 and other figures, directions are defined for convenience of description and ease of understanding. The illustrated directions are defined based on an orientation when a user normally uses a laptop computer, and are merely examples.

First unit 100 is a tablet computer. First unit 100 includes display 101 on first main face 100a. Display 101 is, for example, a liquid crystal display panel. Display 101 is also a touch panel capable of accepting touch operation by a user. First unit 100 includes, for example, a central processing unit (CPU), a volatile memory such as random access memory (RAM), non-volatile memories such as a read only memory (ROM) and a solid state disk (SSD), and a battery. In the non-volatile memories (such as the ROM and the SSD), an operating system (OS), various application programs, various data, and others are stored. The central processing unit (CPU) reads the OS, the application programs, and the various data, and executes arithmetic processing to achieve various functions.

Second unit 200 includes an input part that allows the user to perform input processing and allows detachment of first unit 100. Second unit 200 includes input unit 300, socket 400, and hinges 500.

Housing 310 of input unit 300 is made of, for example, a resin or a metal such as a magnesium alloy. Input unit 300 is provided with, at its primary surface 300a (top face), the input part that includes, for example, keyboard 301, touch pad 302, and a plurality of operation buttons 303.

Input unit 300 is incorporated with a central processing unit (hereinafter appropriately referred to as "CPU 330") for performing various processing including outputting of signals corresponding to user operations made on keyboard 301, touch pad 302, and the plurality of operation buttons 303.

Socket 400 can accommodate lower side 100S of first unit 100.

Hinges 500 couple rear side 300S of input unit 300, which lies in a length direction, and lower side 400S of socket 400 so that input unit 300 and socket 400 are relatively rotatable.

Socket 400 is provided with a connector to be connected to a connector of first unit 100 while lower side 100S of first unit 100 is being accommodated. Via these connectors, various signals and electric power can be exchanged between first unit 100 and second unit 200. The signals that can be output to first unit 100 from second unit 200 include, for example, those from the input part of input unit 300 that includes keyboard 301, touch pad 302, and the plurality of operation buttons 303. First unit 100 can receive these signals to perform control based on the received signals. Thus, with first unit 100 mounted to second unit 200, electronic device 1 can be used as a laptop computer. Alternatively, first unit 100 itself can be used as a tablet computer.

1-2. Heat Conductive Structure

Figure 2:
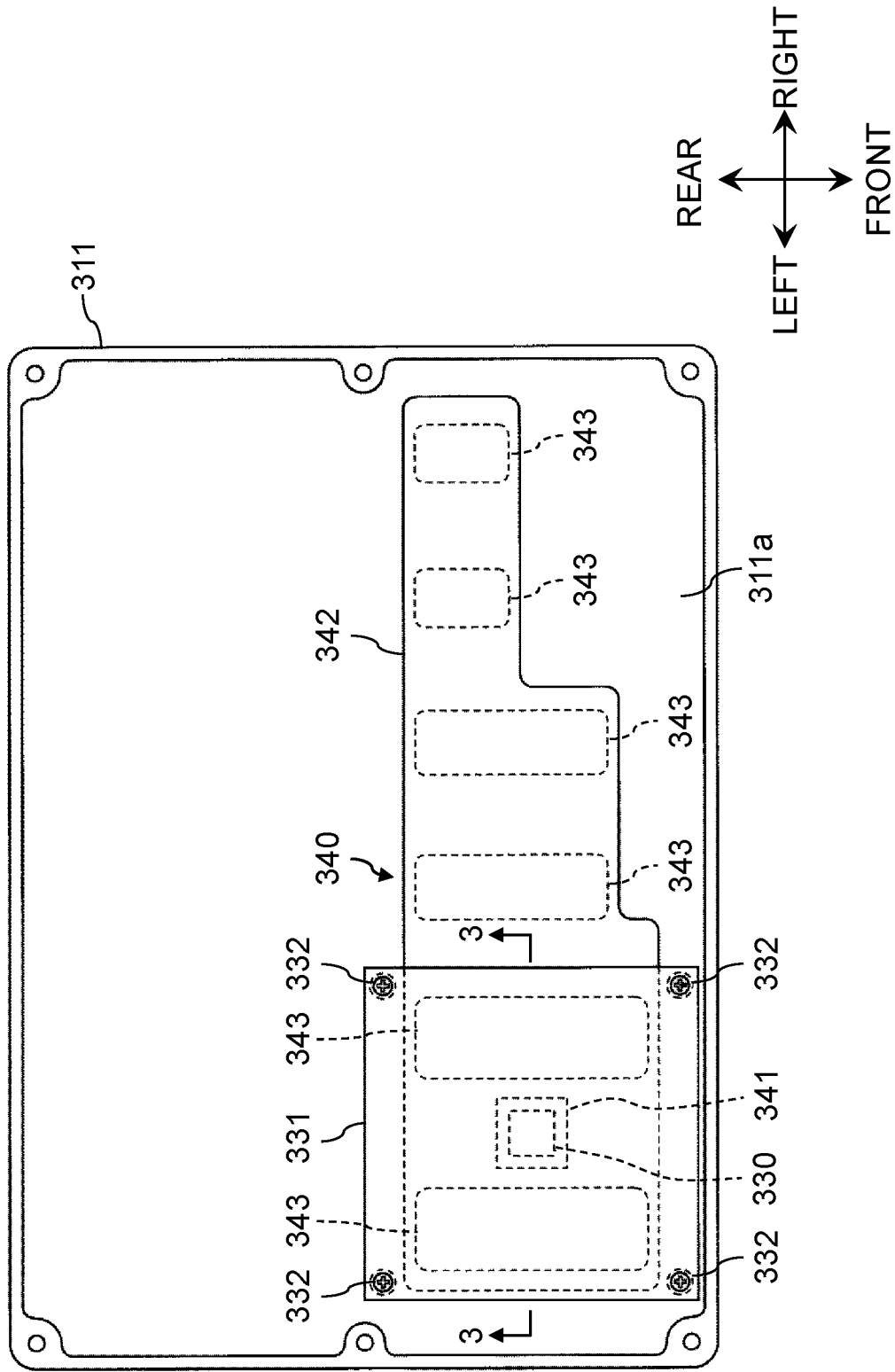
FIG. 2 is a schematic plan view of main portions of the electronic device according to this exemplary embodiment, where an upper housing of a second unit is removed.
Figure 3:
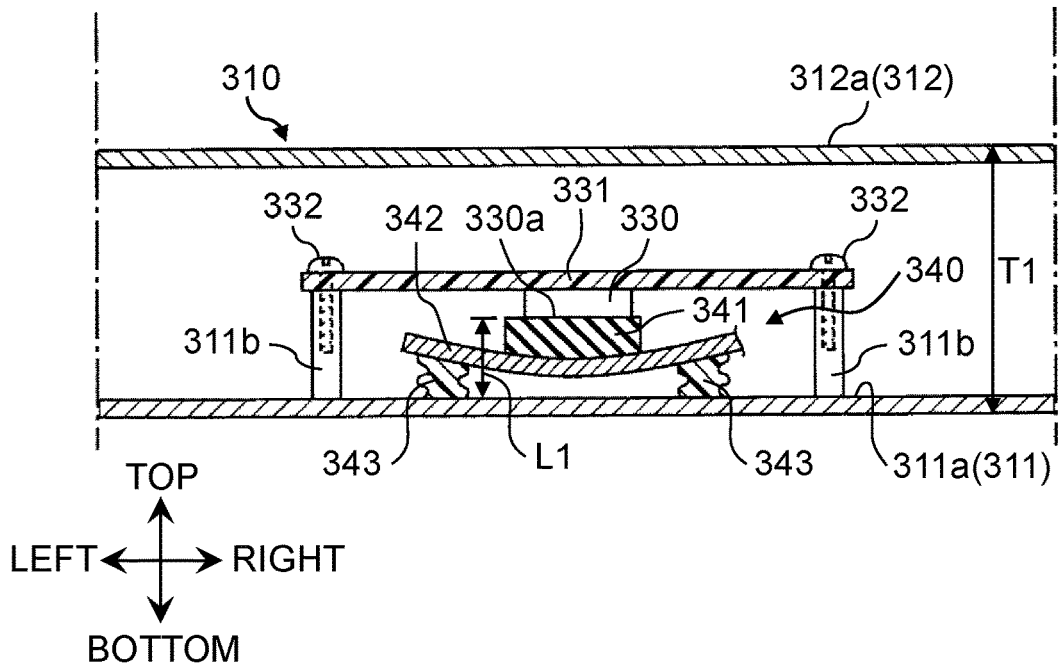
FIG. 3 is a cross-sectional view taken along line 3-3 illustrated in FIG. 2.

Input unit 300 according to this exemplary embodiment has a so-called fan-less configuration where a fan for radiating heat generated in CPU 330 is not provided. A heat conductive structure for transmitting and radiating heat generated in CPU 330 of input unit 300 to housing 310 will now be described herein. FIG. 2 is a schematic plan view of main portions of electronic device 1 according to this exemplary embodiment, where an upper housing of second unit 200 is removed. FIG. 3 is a cross-sectional view taken along line 3-3 illustrated in FIG. 2. In FIG. 3, shapes are emphasized for ease of understanding of structures and actions.

CPU 330 is accommodated in a space in housing 310 constructed with lower housing 311 and upper housing 312. CPU 330 is fixed to circuit board 331. Circuit board 331 is fixed, with a corresponding number of screws 332, to a plurality of bosses 311b formed projected inward from bottom face 311a of lower housing 311 of input unit 300. Circuit board 331 is made of a hard resin, for example.

CPU 330 is fixed to a face of circuit board 331, which faces bottom face 311a of lower housing 311. Heat conductor 340 for transmitting heat generated in CPU 330 to lower housing 311 is provided between bottom face 311a of lower housing 311 and CPU 330. Heat conductor 340 is provided such that its lower side abuts bottom face 311a of lower housing 311, and its upper side abuts CPU 330.

Heat conductor 340 includes heat conductive rubber 341, heat conductive plate 342, and heat conductive support members 343, which are disposed in order in a direction from CPU 330 to bottom face 311a of lower housing 311.

Heat conductive rubber 341 is formed from flat rubber having higher thermal conductivity than ordinary rubber. Heat conductive rubber 341 has elasticity, and closely abuts (comes into close contact to), in an elastic-deformed state, and adheres, with its adhesiveness, CPU 330 and heat conductive plate 342.

Heat conductive plate 342 is formed from a copper plate that is a metal having relatively higher thermal conductivity. Heat conductive plate 342 functions as a flat spring having weaker bending elasticity than the elasticity of heat conductive rubber 341. Heat conductive plate 342 may be formed from a sheet type heat pipe including a plurality of copper plates, for example, as long as a material of which functions as a flat spring. Heat conductive plate 342 is configured to have a left-right width greater than a left-right width of circuit board 331, but approximately identical to a left-right width of bottom face 311a of lower housing 311 so that heat can transmit and disperse wider to bottom face 311a of lower housing 311.

Heat conductive support members 343 are provided in plural numbers. Heat conductive support members 343 are each made of an elastic material having at least predetermined degrees of thermal conductivity and elasticity. The elastic material is, specifically, a double sided adhesive sheet. In FIG. 3, a thickness of the double sided adhesive sheet is emphasized for ease of understanding of actions due to elasticity, for example. However, the thickness falls within a range from approximately 0.1 mm to approximately 2 mm, for example. The double sided adhesive sheet has a degree of hardness (Asker C) in a range from 20 to 35 inclusive, for example. The double sided adhesive sheet can thus relatively flexibly deform, and can absorb a shock appropriately. The double sided adhesive sheet has a thermal conductivity of 2.5 W/m·K or greater, for example. Heat can thus effectively transmit from heat conductive plate 342 to lower housing 311 via the double sided adhesive sheet. Each of thicknesses of the members configuring heat conductor 340, i.e., heat conductive rubber 341, heat conductive plate 342, and heat conductive support members 343, represents a length in a top-bottom direction shown in FIG. 3. In other words, the thickness represents a length of housing 310 in the top-bottom direction (thickness direction).

A total thickness of heat conductive rubber 341, heat conductive plate 342, and heat conductive support members 343 before disposed between CPU 330 and lower housing 311 is set greater by a predetermined amount than gap L1 between CPU 330 (face 330a facing bottom face 311a) and bottom face 311a of lower housing 311. The plurality of heat conductive support members 343 is provided to abut heat conductive plate 342 at a plurality of positions separated away from heat conductive rubber 341 in a surface direction such that heat conductive plate 342 is bending deformable toward bottom face 311a about a portion at which heat conductive rubber 341 abuts heat conductive plate 342. As shown in FIG. 3, heat conductive plate 342 bending-deforms downward like a flat spring due to its weaker bending elasticity than the bending elasticity of heat conductive rubber 341. Heat conductive support members 343 also deform due to their elasticity.

1-3. Action

Actions and effects of this exemplary embodiment will now be described herein.

Conventional issues will now first be described herein. As described in the Description of the Related Art, in the electronic device disclosed in Unexamined Japanese Patent Publication No. 2014-116335, the heat conductive sheet is only present between the housing and the CPU. If a shock is applied externally to the housing of the electronic device, the shock can easily transmit to the CPU. If a greater gap is present between the housing and the CPU due to an error in size of a product, for example, the heat conductive sheet does not closely abut fully the housing and the CPU, and accordingly enough heat radiation performance cannot be achieved.

Figure 4:
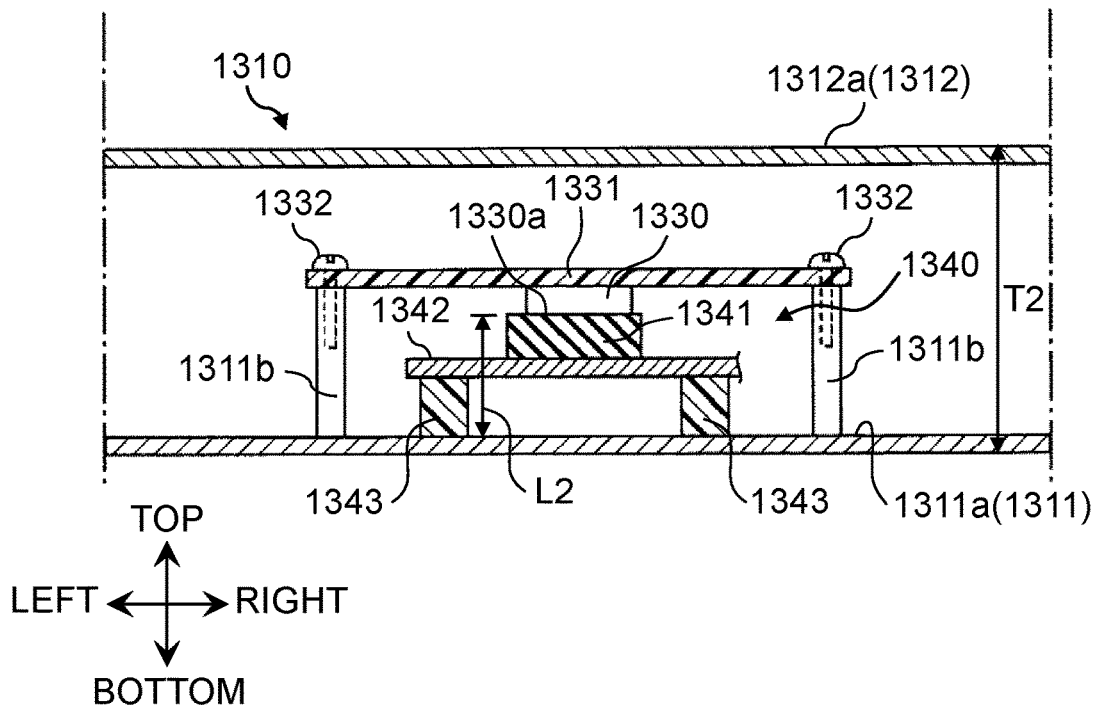
FIG. 4 is a view for describing a comparative example.

To respond to this issue, the inventor of the present application has designed a comparative example shown in FIG. 4. In the comparative example, similar to the first exemplary embodiment as shown in FIG. 3, heat conducts from CPU 1330 to housing 1310 by heat conductor 1340 including heat conductive rubber 1341, heat conductive plate 1342, and heat conductive support members 1343. However, heat conductive plate 1342 is made of a material having almost no elasticity and flexibility, such as die-cast aluminum, and heat conductive support members 1343 are formed from ordinary double sided tape having almost no elasticity. Such a configuration has problems as described below. An error in size may normally present in a housing of an electronic device. For example, an error in height size may present in bosses 1311b for attaching circuit board 1331. In addition to errors in size of the housing, a variation in height when circuit board 1331 is attached to bosses 1311b and a variation in height when CPU 1330 is mounted on circuit board 1331 may also present. Such errors and variations lead to a variation in gap L2 (distance) between face 1330a of CPU 1330, which faces bottom face 1311a of lower housing 1311, and bottom face 1311a of lower housing 1311. As a result, if gap L2 (distance) is greater than a standard, heat conductive rubber 1341 would be less likely to closely abut to at least either of CPU 1330 and heat conductive plate 1342. In this case, heat generated in CPU 1330 would be less likely to fully transmit to lower housing 1311. One measure to solve this problem is to increase a thickness of heat conductive rubber 1341 to achieve a close contact. However, if gap L2 (distance) described above is smaller than the standard, heat conductive rubber 1341 could greatly apply pressure to CPU 1330, which could reduce durability of CPU 1330. Increase in thickness of heat conductive rubber 1341 needs increase in thickness T2 of housing 1310 of input unit 1300 to a certain degree, which would go against a demand of further thinner electronic devices in recent years.

In this exemplary embodiment, as shown in FIG. 3, heat conductive plate 342 is formed from a copper plate having bending elasticity, and heat conductive support members 343 are each formed from a double sided adhesive sheet having elasticity. Further, the total thickness of heat conductive rubber 341, heat conductive plate 342, and heat conductive support members 343 before disposed between CPU 330 and lower housing 311 is set greater than gap L1 between CPU 330 and bottom face 311a of lower housing 311, and the plurality of heat conductive support members 343 is disposed to abut heat conductive plate 342 at a plurality of positions separated away from heat conductive rubber 341 in the surface direction such that heat conductive plate 342 is bending deformable toward bottom face 311a about the portion at which heat conductive rubber 341 abuts heat conductive plate 342. Heat conductive plate 342 thus bending-deforms downward like a flat spring due to its weaker elasticity than the elasticity of heat conductive rubber 341, and heat conductive support members 343 also deform due to their elasticity. Heat conductive support members 343 closely abut, due to their elasticity, heat conductive plate 342 and bottom face 311a of lower housing 311. Heat generated in CPU 330 thus appropriately transmits to lower housing 311 via heat conductive rubber 341, heat conductive plate 342, and heat conductive support members 343. Heat transmitted to lower housing 311 disperses and transmits to upper housing 312 and other members, and well radiates externally from whole housing 310.

An error in size of housing 310, a variation in height when circuit board 331 is attached to bosses 311b, and a variation in height when CPU 330 is mounted on circuit board 331 can be absorbed when heat conductive plate 342 bending-deforms like a flat spring due to its bending elasticity weaker than bending elasticity of heat conductive rubber 341 without greatly changing the above-described pressure, as well as heat conductive rubber 341 keeps closely abutting to CPU 330 and heat conductive plate 342. Heat generated in CPU 330 thus appropriately transmits to lower housing 311 via heat conductive rubber 341, heat conductive plate 342, and heat conductive support members 343. In this manner, according to this exemplary embodiment, even if an error in size, a variation in attachment height, and a variation in mounting height are present as described above, good heat radiation performance can be achieved.

Members having higher thermal conductivity have been used as heat conductive rubber 341, heat conductive plate 342, and heat conductive support members 343 for configuring heat conductor 340. Therefore, heat generated in CPU 330 will further effectively transmit to lower housing 311.

Even if housing 310 of electronic device 1 is dropped, for example, and a shock is applied, the elasticity of the plurality of members, i.e., heat conductive rubber 341, heat conductive plate 342, and heat conductive support members 343, prevents as much as possible the shock from transmitting to CPU 330 (heating element). Thus, shock proof performance of electronic device 1 greatly improves.

In this exemplary embodiment, as described above, the total thickness of heat conductive rubber 341, heat conductive plate 342, and heat conductive support members 343 before disposed between CPU 330 and lower housing 311 is set greater than gap L1 between CPU 330 and bottom face 311a of lower housing 311. Heat conductive support members 343 are provided in plural numbers, and abut heat conductive plate 342 at the plurality of positions separated away from heat conductive rubber 341 in the surface direction such that heat conductive plate 342 is bending deformable toward bottom face 311a about the portion at which heat conductive rubber 341 abuts heat conductive plate 342. Even when heat conductive rubber 341 is, for example, increased in thickness for improved shock proof performance, thickness T1 of housing 310 of input unit 300 of electronic device 1 can be less likely to increase. When compared with the comparative example shown in FIG. 4, gap L1 between CPU 330 and bottom face 311a of lower housing 311 can be made smaller than gap L2 in the comparative example. Thickness T1 of housing 310 of input unit 300 can thus be made smaller than thickness T2 of housing 1310 of an input unit according to the comparative example shown in FIG. 4, and thus housing 310 of input unit 300 can be thinner.

1-4. Examples of Application to Other Housings

Figure 5:
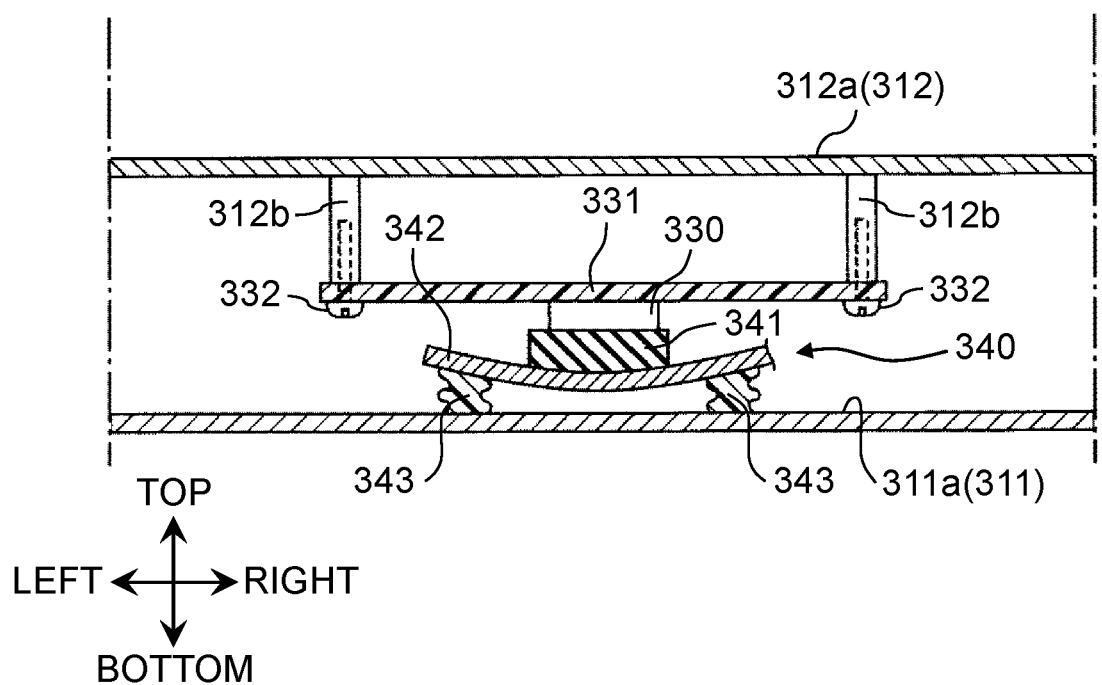
FIG. 5 is a cross-sectional view of an application example to another housing, taken along a line identical to line 3-3 illustrated in FIG. 2.

Examples of application of the above-described heat conductive structure to other housings will now be described herein. FIG. 5 is a cross-sectional view of an application example to another housing, taken along a line identical to line 3-3 illustrated in FIG. 2. Since there is only a small number of differences from FIG. 3, identical numerals or symbols are applied to identical components for ease of comparison with FIG. 3.

In the example shown in FIG. 5, upper housing 312 is provided with bosses 312b, and circuit board 331 is fixed to bosses 312b of upper housing 312 with screws 332. Other points are identical to the example shown in FIG. 3. If an error in housing size and variations in attachment and mounting states are present even in such a configuration, for example, heat conductive plate 342 and the like of heat conductor 340 deforms, as described with reference to FIG. 3. Accordingly, an effect similar to the above-described effect through the example shown in FIG. 3 can thus be achieved.

2. Effects and Other Benefits

Electronic device 1 according to this exemplary embodiment includes housing 310, CPU 330 (heating element) mounted on circuit board 331 accommodated in and fixed to housing 310, and heat conductor 340 for transmitting heat generated in CPU 330 (heating element) to housing 310.

Heat conductor 340 includes heat conductive rubber 341 having elasticity, heat conductive plate 342 having bending elasticity, and heat conductive support members 343, which are disposed between bottom face 311a (a face) of housing 310 and CPU 330 (heating element) in order in a direction from CPU 330 (heating element) to bottom face 311a (the face) so as to abut bottom face 311a (the face) and CPU 330 (heating element).

Heat conductive support members 343 are configured to abut heat conductive plate 342 at a plurality of positions separated away from heat conductive rubber 341 in a surface direction.

Heat conductive plate 342 bending-deformed toward bottom face 311a (the face) is supported by heat conductive rubber 341 and heat conductive support members 343.

Heat radiation performance and shock proof performance can thus be improved in electronic device 1 including housing 310 having a thinner thickness.

In this exemplary embodiment, heat conductive support members 343 are each made of an elastic material.

Heat conductor 340 can deform by heat conductive support members 343 each having elasticity, in addition to heat conductive rubber 341 having elasticity and heat conductive plate 342 having elasticity. The shock proof performance of electronic device 1 can further improve.

In this exemplary embodiment, the elastic material has a degree of hardness (Asker C) in a range from 20 to 35 inclusive.

The elastic material thus relatively flexibly deforms. A shock can appropriately be absorbed.

In this exemplary embodiment, the elastic material has a thermal conductivity of 2.5 W/m·K or greater.

Heat generated in CPU 330 (heating element) can thus appropriately transmit to housing 310.

In this exemplary embodiment, heat conductive support members 343 are double sided adhesive sheets.

Thus, heat conductive support members 343 can be made of a simple material.

Other Exemplary Embodiments

The first exemplary embodiment has been described above and exemplified as the technique of the present disclosure. However, the technique of the present disclosure is not limited to the above-described first exemplary embodiment, but is applicable to another exemplary embodiment where an amendment, a replacement, an addition, or an omission has been made appropriately.

Then, other exemplary embodiments will now be described herein.

In the first exemplary embodiment, the heat conductor according to the present disclosure is applied to CPU 330 of second unit 200. However, the heat conductor according to the present disclosure is also applicable to a CPU of first unit 100. Furthermore, the heat conductor according to the present disclosure is widely applicable to other electronic devices including tablet computers and electronic imaging devices, in which a housing accommodates a heating element such as a CPU.

In the exemplary embodiment, as the heat conductive plate according to the present disclosure, heat conductive plate 342 formed from a copper plate has been exemplified. However, the heat conductive plate according to the present disclosure may be at least a plate having elasticity, such as an aluminum plate or a graphite plate.

In the exemplary embodiment, as the heat conductive support members according to the present disclosure, the plurality of heat conductive support members 343 formed from a plurality of double sided adhesive sheets has been exemplified. However, the heat conductive support members according to the present disclosure may be formed from, for example, a member having a plurality of projections that can abut the heat conductive plate at a plurality of locations such that the heat conductive plate can bending-deform as described above.

The exemplary embodiments have been described above and exemplified as the technique of the present disclosure. The accompanying drawings and detailed description have been provided for this purpose.

Accordingly, the components described in the appended drawings and the detailed description include not only components essential for solving the above problem, but may also include components that are not essential for solving the above problem so as to exemplify the above-mentioned technique. Therefore, it should not be immediately construed that these components that are not essential are essential even if the components are described in the accompanying drawings and the detailed description.

Since the above-described exemplary embodiments are for exemplifying the technique of the present disclosure, various modifications, replacements, additions, and omissions can be made within the scope of the appended claims or of their equivalents.

The present disclosure can widely be used in electronic devices having a heating element in a housing.

What is claimed is:

1. An electronic device comprising:
   a housing;
   a heating element mounted on a circuit board accommodated in and fixed to the housing; and
   a heat conductor which transmits heat generated in the heating element to the housing,
   wherein the heat conductor includes a heat conductive rubber having elasticity, a heat conductive plate having bending elasticity, and heat conductive support members,
   the heat conductive rubber, the heat conductive plate and the heat conductive support members are disposed between a face of the housing and the heating element in order in a direction from the heating element to the face so as to abut the face and the heating element,
   the heat conductive support members are formed from an elastic material, and configured to abut the heat conductive plate at a plurality of positions separated away from the heat conductive rubber in a surface direction, and
   the heat conductive plate is supported by the heat conductive rubber and the heat conductive support members to be bending-deformed toward the face so as to be convex toward the face.

2. The electronic device according to claim 1, wherein the elastic material has a degree of hardness (Asker C) in a range from 20 to 35 inclusive.

3. The electronic device according to claim 1, wherein the elastic material has a thermal conductivity of 2.5 W/m·K or greater.

4. The electronic device according to claim 1, wherein the heat conductive support members are double sided adhesive sheets.

* * * * *